United States Patent
Petersson et al.

(10) Patent No.: US 7,373,119 B2
(45) Date of Patent: May 13, 2008

(54) METHOD AND APPARATUS FOR ANALOG-TO-DIGITAL CONVERSION

(75) Inventors: Peter Magnus Petersson, Järfälla (SE); Mats Johansson, Enskede (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1108 days.

(21) Appl. No.: 10/091,596

(22) Filed: Mar. 7, 2002

(65) Prior Publication Data

US 2003/0171100 A1  Sep. 11, 2003

(51) Int. Cl.
 *H04B 7/12* (2006.01)
 *H04B 1/18* (2006.01)

(52) U.S. Cl. ............... 455/141; 455/150.1; 455/183.1; 455/275; 375/316; 375/346; 324/322

(58) Field of Classification Search ............. 455/530.1, 455/95, 127.4, 131, 136, 141, 147, 164.1, 455/164.2, 150.1, 151.2, 161.1, 183.1, 183.2, 455/209, 216, 217, 230, 255, 256, 260, 275, 455/283, 310, 311, 334, 296
See application file for complete search history.

(56) References Cited

U.S. PATENT DOCUMENTS

| | | | |
|---|---|---|---|
| 4,502,078 A * | 2/1985 | Steckler et al. | 348/727 |
| 4,791,577 A | 12/1988 | Winter | 364/485 |
| 5,187,719 A * | 2/1993 | Birgenheier et al. | 375/226 |
| 5,629,703 A | 5/1997 | Lewallen | 341/155 |
| 5,640,698 A * | 6/1997 | Shen et al. | 455/323 |
| 5,739,691 A * | 4/1998 | Hoenninger, III | 324/322 |
| 5,970,053 A * | 10/1999 | Schick et al. | 370/252 |
| 2003/0040292 A1 * | 2/2003 | Peterzell et al. | 455/147 |

FOREIGN PATENT DOCUMENTS

| | | |
|---|---|---|
| JP | 7-10128 | 1/1995 |
| WO | WO 98/59252 | 12/1998 |
| WO | WO 00/08764 | 2/2000 |

OTHER PUBLICATIONS

U.S. Appl. No. 09/973,805, filed Oct. 11, 2002.
Communication dated May 23, 2006 issued in corresponding European Application No. 03743655.7-2206.
Summons to attend oral proceedings dated Feb. 5, 2007 issued in corresponding European Application 03743655.7-2206.

* cited by examiner

*Primary Examiner*—Tony T. Nguyen
(74) *Attorney, Agent, or Firm*—Nixon & Vanderhye P.C.

(57) ABSTRACT

The present invention eliminates the need for an anti-aliasing filter in a receiver that employs an analog-to-digital converter. By maintaining a predetermined relationship between a local oscillator frequency and the sampling frequency of the analog-to-digital converter, aliasing that would normally occur in the desired pass band is avoided. More specifically, the frequency of the periodic signal provided to the mixer is an integer multiple of half the sampling rate of the analog-to-digital converter. In a preferred, non-limiting example embodiment, the sampling rate of the analog-to-digital converter $F_{ADC}$ and the frequency of the local oscillator $F_{LO}$ are related by the following: $F_{LO}=n*F_{ADC}/2$, where n is any positive integer.

17 Claims, 4 Drawing Sheets

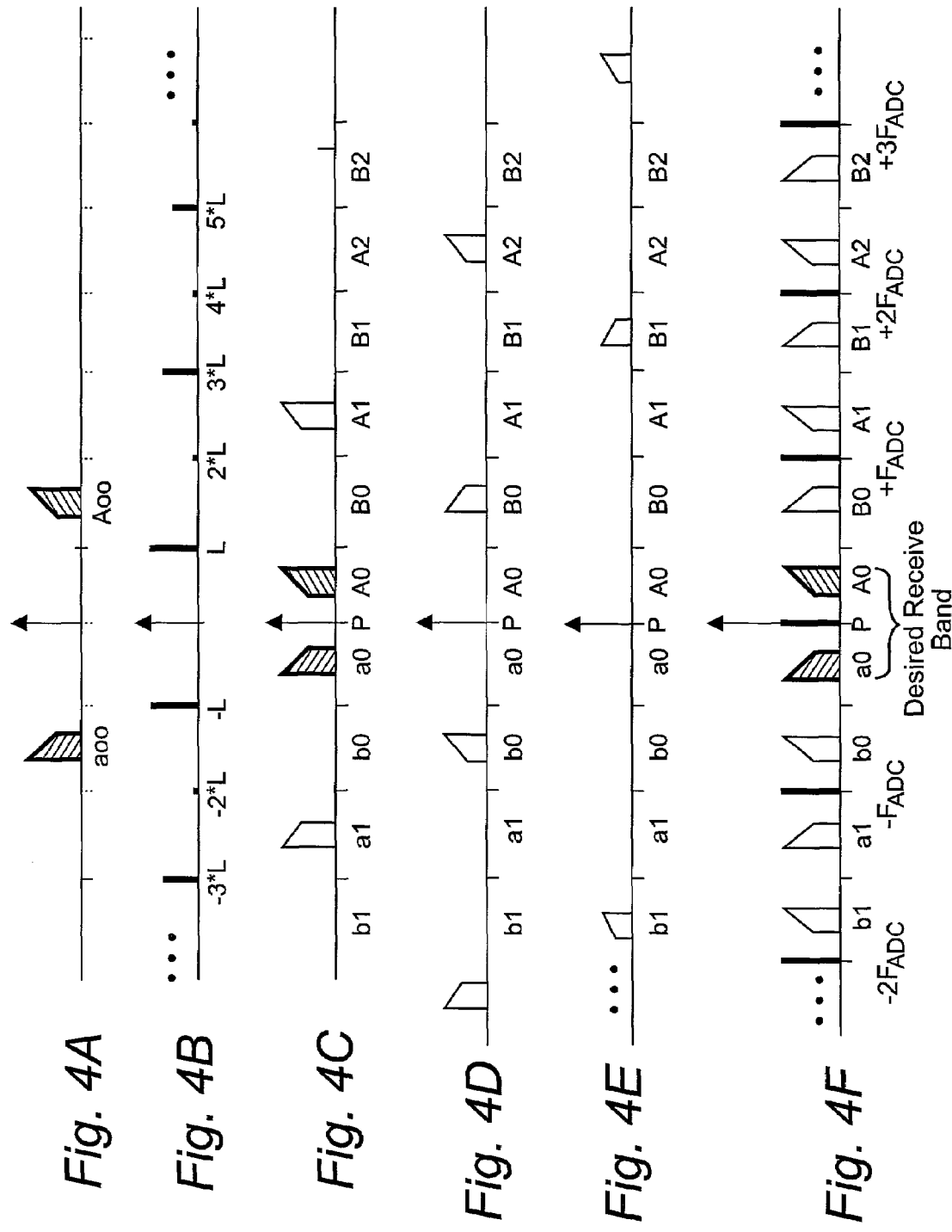

METHOD AND APPARATUS FOR ANALOG-TO-DIGITAL CONVERSION

FIELD OF THE INVENTION

The present invention relates generally to analog-to-digital conversion, and particularly, to analog-to-digital conversion in radio receivers.

BACKGROUND

Analog-to-digital converters (ADCs) are often found in signal receiving applications such as radio receivers. In a radio receiver, a radio frequency (RF) analog signal is frequency down-converted by a mixer. The mixer uses a local oscillator (LO) signal from a local oscillator source to convert the received signal into a frequency range suitable for sampling by an analog-to-digital converter. Another oscillator controls the sampling rate of the analog-to-digital converter. A filter is required between the mixer and the analog-to-digital converter in order to minimize spurious signals caused by the mixing and the sampling processes.

The filter is sometimes referred to as "anti-aliasing" filter because it suppresses the spectral components that are outside the Nyquist band. In other words, it prevents out-of-band frequency components caused by the mixing and sampling, (i.e., the aliased signals), from contaminating the analog-to-digital converter output. Absent such a filter, part of the frequency spectrum outside the desired frequency band will be aliased into the desired frequency band producing undesired spurious signals. This aliasing effect may also occur even when such a filter is used, if it is not sufficiently accurately designed or manufactured.

An example of this aliasing effect is now described in conjunction with the frequency spectrums shown in FIGS. 1A-1G. FIG. 1A illustrates the location of the desired received signal frequency band, Aoo, and its negative counterpart aoo. FIG. 1B shows the frequency spectrum for the local oscillator (LO) signal used by the mixer to frequency down-convert the received RF signal into the intermediate frequency (IF) band, baseband, or other frequency band suitable for analog-to-digital conversion. The local oscillator signal has a fundamental frequency at ±L, a second harmonic at ±2L, a third harmonic at ±3L, a fourth harmonic at ±4L, a fifth harmonic at ±5L, and so on. Typically, only the odd harmonics are problematic because the even harmonics are generally very small in magnitude.

FIG. 1C illustrates the result of mixing of the local oscillator frequency fundamental frequency L (shown in FIG. 1B) and the receive band of the desired signal shown in FIG. 1A. The desired signal and its negative image have been shifted to lower frequency bands A0, a0 and to higher frequency bands A1, a1, (which are outside the frequency band of interest) with first order harmonics of $F_{LO}(\pm L)$. FIG. 1D illustrates the result of mixing the third order harmonic of the local oscillator signal (±3L) and the receive band, resulting in the spectrum components B0, b0 and A2, a2. Similarly, FIG. 1E shows the result of mixing the fifth order harmonics of the local oscillator signal (±5L) and the receive band, resulting in the spectrum components B1, b1. Again, only the odd-order harmonics of the local oscillator are of practical concern.

FIG. 1F shows the spectral result of the output of the mixer when the fundamental and the odd harmonics of the local oscillator are mixed with the desired signal in the receive band. A filter characteristic, represented as the thick-line trapezoid, can remove those unwanted spectral components shown in dotted lines, leaving only the desired signal at a0, A0 along with those undesired spectral components that were not filtered, e.g., b0, B0. Unfortunately, these in-band, third or higher order harmonics cause undesired aliasing in the analog-to-digital conversion.

FIG. 1G shows a sampled mixer output from an analog-to-digital converter, when a non-optimal filter, such as that shown in FIG. 1F, is used to filter the mixer output. The undesired, aliased signals are shown as "dotted" spectrums, and the desired signals are shown as "hatched" spectrums. The sampling frequency of the analog-to-digital converter and its harmonics are shown as thick black vertical lines centered for each spectral copy and are indicated as $F_{ADC}$. The aliasing problem is particularly troublesome when the analog-to-digital converter sampling rate is relatively high or higher than the local oscillator frequency. Although the sampling frequency satisfies the Nyquist sampling theorem and is more than twice the highest frequency of the receive band for the desired signal a0, A0, the sampling frequency is not more than twice the highest frequency of the mixer products b0, B0. As a result, those sampled, third harmonic signals b0, B0 are aliased into the frequency range of the desired signals. Being in the desired frequency band, the aliased signals cannot be readily removed by a filter, (e.g., a digital filter).

Thus, it is clear that the mixer output filter performs an important function in the receiver. However, such filters, (assuming they can perform the required filtering function), have their disadvantages. First, they must be very accurately designed and constructed in order to eliminate the aliasing effect. To do this, the filter must be usually of a high order so that it has a sharp cutoff and a low ripple in the pass band in order to remove all signals except a0, A0 in FIG. 1F. Second, such filters are typically expensive, and even then, have certain variances and losses in the pass band that require compensation. Third, the filter must be matched to both source and load impedance in order to function properly. The mixer "source" impedance is typically low, and the analog-to-digital converter "load" impedance is typically high and slightly capacitive. Because high performance analog-to-digital converters usually suffer from decreasing linearity as the voltage swing over their input increases, it is beneficial to keep the load impedance as low as possible. Impedance matching is difficult because of the non-linear input impedance of the analog-to-digital converter, which means there is no fixed impedance value to use as a reference when calculating the filter impedance level. This non-linear impedance results in an anti-aliasing filter whose transfer function depends on the input signal's amplitude and frequency. As a result, the filter's bandwidth, insertion loss, and ripple will not match specifications for a fixed load impedance. Thus, there are several reasons why it is undesirable to use a filter or impedance transformer between the mixer and the analog-to-digital converter. Still, there is a need to avoid spurious signals in the pass band caused by aliasing.

The present invention solves the above problems and meets certain desirable objectives by providing a method and apparatus that eliminates the need for such an anti-aliasing filter while, at the same time, ensuring that aliasing in the pass band does not occur as a result of the mixing and sampling processes. In particular, the present invention relates the mixer's local oscillator frequency with the frequency of the analog-to-digital converter sampling rate in such a way so as to avoid aliasing in the desired receive band. In particular, the frequency of the local oscillator signal is an integer multiple of half of a sampling rate of the analog-to-digital converter. When the integer is one, the frequency of the local oscillator signal is one half of the sampling rate of the analog-to-digital converter. In a preferred, non-limiting, example embodiment, the sampling rate of the analog-to-digital converter and the frequency of the local oscillator are related by the following: $F_{LO}=n*F_{ADC}/2$, where n is any positive integer.

A common oscillator is preferably (though not necessarily) used to generate a periodic signal that is then used to generate both the local oscillator signal and the sampling rate signal. A frequency changer, receiving the periodic signal from the common oscillator, provides the local oscillator signal to the mixer and a sampling signal to the analog-to-digital converter. The frequency changer includes a first frequency divider for dividing the periodic signal in half to generate the local oscillator signal and for dividing the periodic signal by a positive integer to generate the sampling signal of the analog-to-digital converter.

The present invention may be used in a receiver without an anti-aliasing filter between the mixer and the analog-to-digital converter. Thus, the expense of such filter is avoided. In addition, the low impedance output of the mixer can be directly coupled to the analog-to-digital converter without an impedance matching network. Alternatively, a simplified, less expensive filter may used between the mixer and the analog-to-digital converter.

BRIEF DESCRIPTION OF THE DRAWINGS

The foregoing and other objects, features, and advantages of the present invention may be more readily understood with reference to the following description taken in conjunction with the accompanying drawings.

FIGS. 4A-4F show magnitude spectra of signals at various points of the receiver in FIG. 2.

DETAILED DESCRIPTION

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details. In some instances, detailed descriptions of well-known radio circuit components and devices, receiver signal processing methods and techniques, etc. are omitted so as not to obscure the description of the present invention with unnecessary detail. Moreover, individual function blocks are shown in some of the figures. Those skilled in the art will appreciate that the functions may be implemented using individual hardware circuits, using software functioning in conjunction with a suitably programmed digital microprocessor or general purpose computer, using an application specific integrated circuit (ASIC), and/or using one or more digital signal processors (DSPs).

Figure 1A:
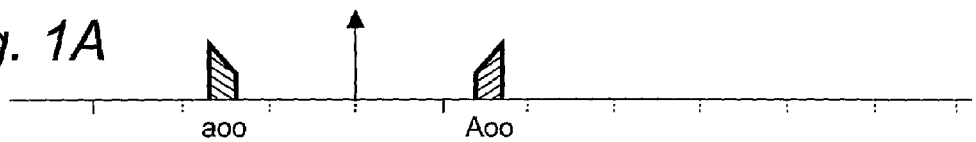
FIGS. 1A-1G show magnitude spectra of signals at various points in a receive chain that incorporates an analog-to-digital converter.
Figure 1B:
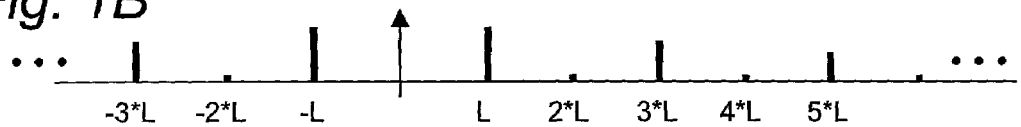
Figure 1C:
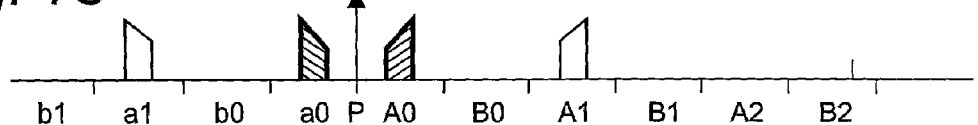
Figure 1D:
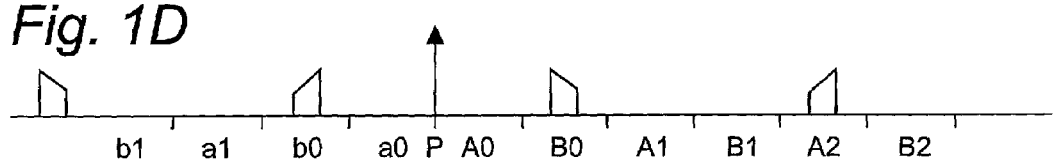
Figure 1E:
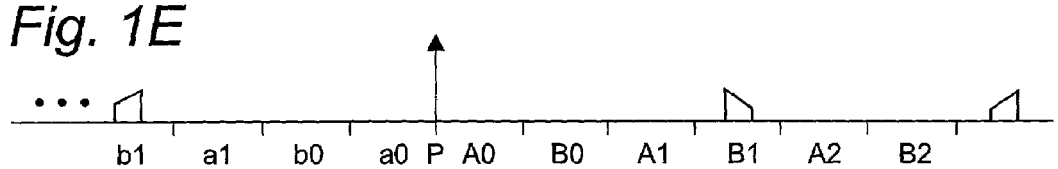
Figure 1F:
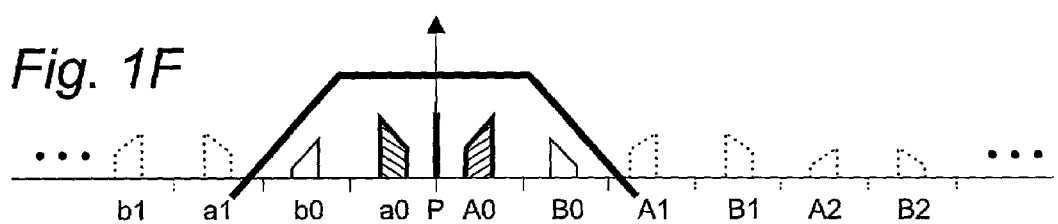
Figure 1G:
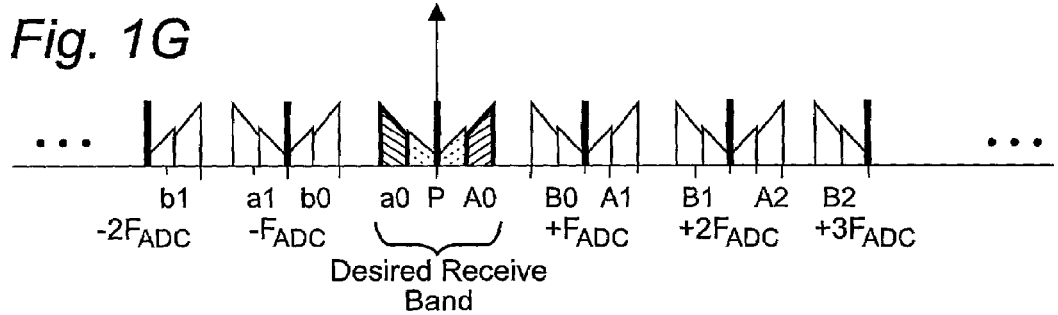
Figure 2:
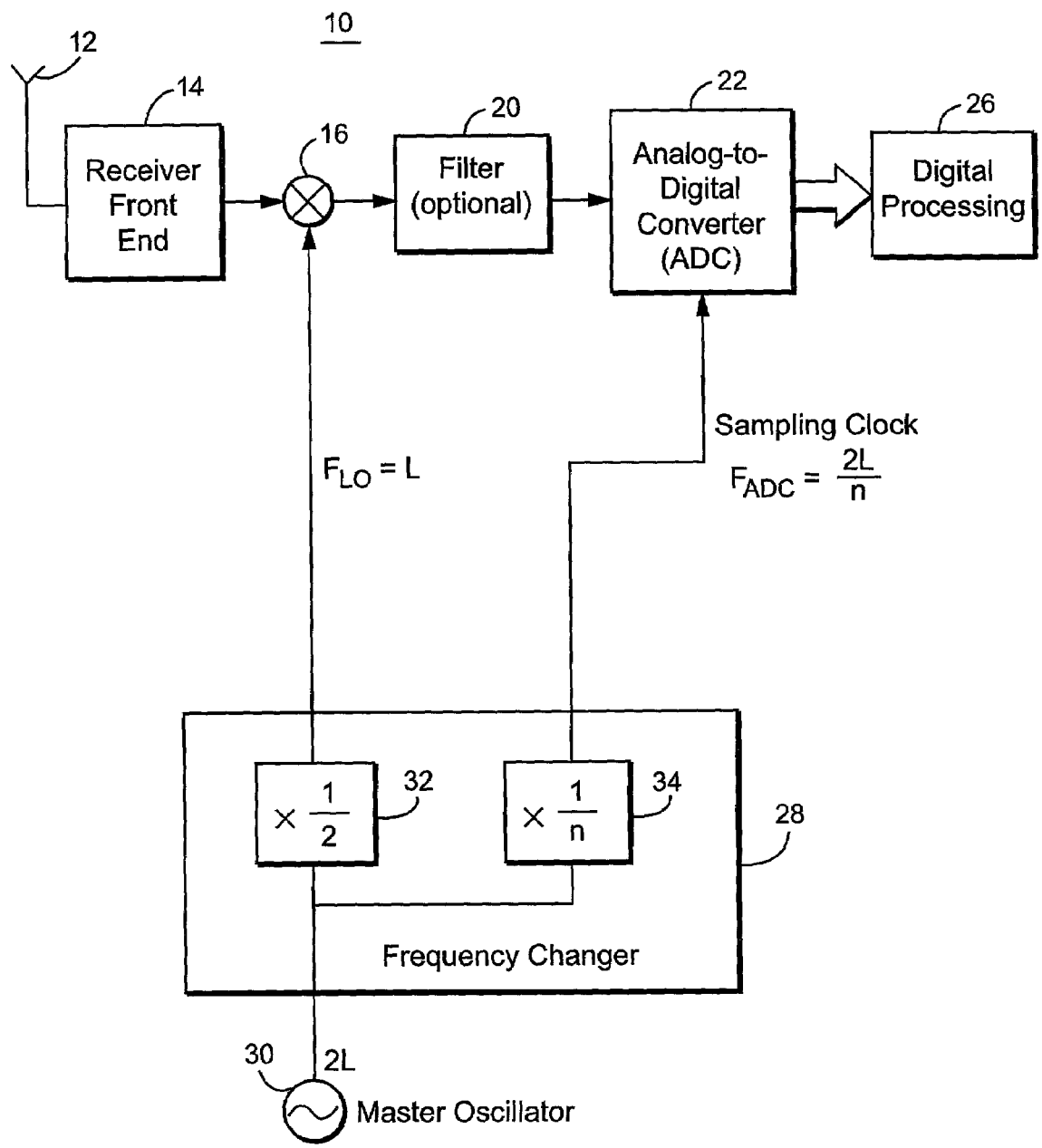
FIG. 2 illustrates a receiver in which an example, non-limiting implementation of the present invention is employed.

FIG. 2 shows an example radio receiver 10 that employs an analog-to-digital converter (ADC) 22. Receiver 10 includes an antenna 12 for detecting a desired RF signal in an RF receive band to a receiver front end 14. The receive band may encompass one or several channels. The front end 14 may include analog signal processing circuitry that performs such functions as low noise amplification, frequency band selection, and possibly, a first heterodyning stage. A band-limited analog signal from the front end 14 is provided to a mixer 16, which using a local oscillator (LO) signal $F_{LO}$, shifts the received signal into a frequency range suitable for sampling by an analog-to-digital converter 22. An optional, inexpensive, anti-aliasing filter 20 may be employed if desired. However, an advantage of the present invention is that no anti-aliasing filter is needed. In any event, the analog signal output by the mixer 16 (or the optional filter) is sampled in the analog-to-digital converter 22 to generate a corresponding digital signal. The sampling rate of the analog-to-digital converter 22 is controlled by a sampling clock $F_{ADC}$. The digital output from the analog-to-digital converter is provided to digital processing circuitry 26 for further processing. If the receiver is a multi-carrier radio receiver, the digital processing circuitry 26 may include a channelizer which selects different channels/frequency carriers contained in the receive band.

The local oscillator frequency $F_{LO}$ and the sampling clock frequency $F_{ADC}$ are generated by a frequency changer 28 which is supplied by a master or common oscillator 30. The frequency changer 28 includes a first frequency divider 32 that divides the output of the master oscillator in half. Frequency divider 34 divides the output of the master oscillator by n, where n is any positive integer. The master oscillator output outputs a periodic signal having a frequency 2L. The periodic signal can be a sine wave, a square wave, or any other periodic signal wave form. Moreover, the signals $F_{LO}$ and $F_{ADC}$ can be any type of signal which is acceptable to the mixer 16 and the analog-to-digital converter 22, respectively. The frequency changer 28 can be any appropriate frequency changer mechanism such as a commercially available frequency divider or a commercially available frequency converter. The values of L and n depend on the particular receiver design. $F_{LO}=L$ and is selected in accordance with a determined receive band. $F_{ADC}=2L/n$ and is selected in accordance with a predetermined sampling rate range of the analog-to-digital converter 22. $F_{LO}$ and $F_{ADC}$ are related in accordance with the following. $F_{LO}=n*F_{ADC}/2$, where n is any positive integer. Although a single master oscillator 30 is shown, two separate oscillators may be employed to generate $F_{LO}$ at L and $F_{ADC}$ at 2L/n. Such separate oscillators may or may not be synchronized.

Figure 3:
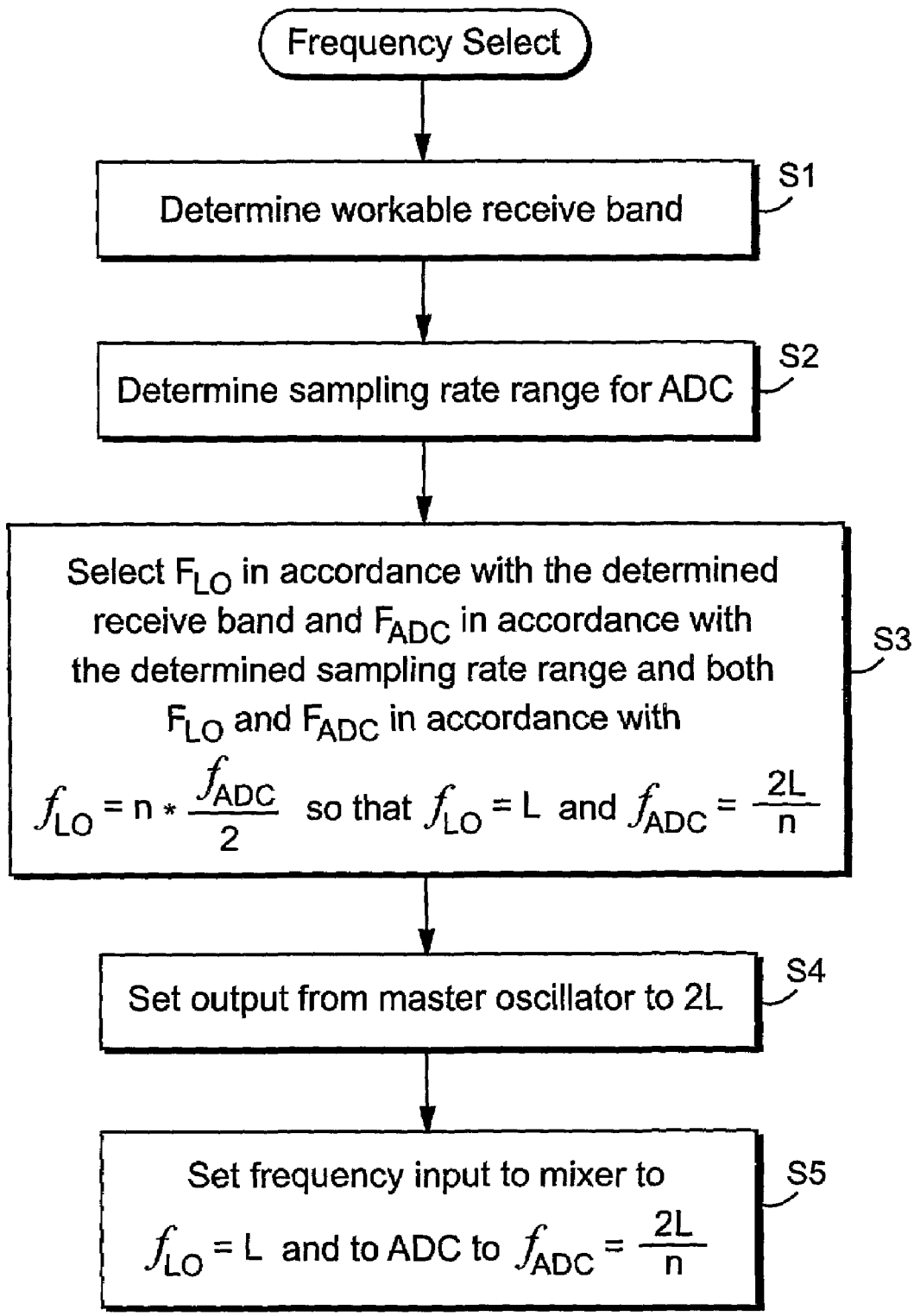
FIG. 3 illustrates a flowchart outlining procedures in accordance with an example, non-limiting method in accordance with the present invention.

Reference is now made to the Frequency Select procedures shown in FIG. 3. First, a workable or required receive band is determined (step S1) for the receiver. In addition, the sampling rate range for the analog-to-digital converter is determined (step S2). A receiver designer may or may not have control over one or both of these two parameters. Accordingly, $F_{LO}$ is selected in accordance with the determined receive band, and $F_{ADC}$ in accordance with the determined sampling rate range. However, both $F_{LO}$ and $F_{ADC}$ are also determined in accordance with the relationship: $F_{LO}=n*F_{ADC}/2$ so that $F_{LO}=L$ and $F_{ADC}=2L/n$ (step S3). Knowing the value of L needed for the mixer, the output from the master oscillator is set to 2L (step S4). The frequency input to the mixer $F_{LO}$ is set to L, and the sampling rate input $F_{ADC}$ to the analog-to-digital converter is set to $F_{ADC}=2L/n$ (step S5).

The relationship between the local oscillator frequency and the analog-to-digital sampling rate eliminates aliased signals in the desired receive band. In this regard, reference is made now to the frequency spectra shown in FIGS. 4A-4F. FIG. 4A illustrates the location of the desired receive signal frequency band, Aoo, and its negative counterpart aoo. FIG. 4B shows the frequency spectrum for the local oscillator signal used by the mixer to frequency downconvert the received signal. As in FIG. 1, the local oscillator signal has a fundamental frequency of ±L, second harmonics at ±2L, third harmonics at ±3L, and so on.

FIG. 4C illustrates the result of mixing the local oscillator fundamental frequency L (shown in FIG. 4B) and the receive band with the desired signal (shown in FIG. 4A). The receive band and its negative image have been shifted to lower frequency bands A0, a0 and to higher frequency bands A1, a1 with first order harmonics of $F_{LO}(\pm L)$. FIG. 4D illustrates the result of mixing the third order harmonic of the local oscillator signal (±3L) and the receive band resulting in the spectrum components B0, b0 and A2, a2. Similarly, FIG. 4E shows the result of mixing the fifth order harmonic of the local oscillator signal ±5L and the receive band resulting in the spectrum components at B1, b1 and A3, a3. Assuming the mixer is well balanced so that the even harmonics cancel each other, only the odd order harmonics of the local oscillator are of practical concern. FIG. 4F shows the result of when the fundamental and all harmonics from the mixer are superimposed and sampled in the analog-to-digital converter with a sampling/clock frequency of $F_{ADC}=2*L(n=1)$ in this example. Only the desired signals A0, a0 are in the desired receive band. The remaining signals can be easily filtered out in the subsequent digital processing unit 26.

In FIG. 4, the shifted signal (shifted with $\pm L=F_{ADC}/2$ and its harmonics) fed into the analog-to-digital converter (ADC) (FIGS. 4C-4E) sums up at spectrum positions equal to all aliased signal bands created due to sampling by the ADC at a frequency of $F_{ADC}/2$ (FIG. 4F). This is the case for $L=n*F_{ADC}/2$. The aliased signals are essentially added to the desired signal in a harmless way when $F_{LO}=n*F_{ADC}/2$. Thus, the sampled mixer output signal ends up at the ADC output with just a0, A0.

By employing a particular relationship between the local oscillator frequency and the analog-to-digital converter sampling frequency, the need for an anti-aliasing filter between the local oscillator and the analog-to-digital converter is eliminated. In addition, a single common oscillator may be used to generate both the local oscillator signal and the ADC sampling clock may be employed which is more cost effective especially if this master oscillator must provide signals with very low jitter. This may also decrease the jitter in the analog-to-digital converter output signal. Without an anti-aliasing filter, the cost of the filter is eliminated. In addition, the regularly low impedance output of the mixer can be favorably coupled directly to the analog-to-digital converter input without impedance matching. The low impedance mixer source masks the non-linear input capacitance of the analog-to-digital converter without introducing any extra loss.

While the present invention has been described with respect to particular embodiments, those skilled in the art will recognize that the present invention is not limited to these specific exemplary embodiments. Different formats, embodiments, and adaptations besides those shown and described as well as many variations, modifications, and equivalent arrangements may also be used to implement the invention. Therefore, while the present invention has been described in relation to its preferred embodiments, it is to be understood that this disclosure is only illustrative and exemplary of the present invention. Accordingly, it is intended that the invention be limited only by the scope of the claims appended hereto.

What is claimed is:

1. An apparatus comprising:
    a mixer for mixing a received signal and a local oscillator signal and generating an analog, frequency converted signal, and
    an analog-to-digital converter for converting the analog, frequency-converted signal into a corresponding digital signal,
    wherein the apparatus is used in a receiver without a filter between the mixer and the analog-to-digital converter, and
    wherein a frequency of the local oscillator signal is set in relation to a frequency of a sampling rate of the analog-to-digital converter to avoid aliasing in a desired receive band.

2. The apparatus in claim 1, wherein the frequency of the local oscillator signal is an integer multiple of half of the sampling rate of the analog-to-digital converter.

3. The apparatus in claim 1, wherein the frequency of the local oscillator signal $F_{LO}$ is $F_{LO}=n*F_{ADC}/2$, where $F_{ADC}$ is the sampling rate of the analog-to-digital converter, and n is a positive integer.

4. The apparatus in claim 1, further comprising:
    an oscillator for generating a periodic signal,
    wherein the periodic signal is used to generate both the local oscillator signal and a sampling rate signal for the analog-to-digital converter.

5. The apparatus in claim 4, further comprising:
    a frequency changer, receiving the periodic signal from the oscillator, for providing the local oscillator signal to the mixer and a sampling rate signal to the analog-to-digital converter.

6. The apparatus in claim 5, wherein the frequency changer includes a first frequency divider for dividing the periodic signal in half to generate the local oscillator signal and for dividing the periodic signal by an integer to generate the sampling rate signal of the analog-to-digital converter.

7. The apparatus in claim 1, wherein the analog, frequency-converted signal from the mixer is coupled directly to the analog-to-digital converter.

8. The apparatus in claim 1, further comprising:
    an antenna;
    a front end for processing a radio frequency signal received via the antenna; and
    digital processing circuitry for processing the digital signal.

9. An apparatus comprising:
    a mixer for mixing a received signal and a local oscillator signal to generate an analog, frequency-converted signal, and
    an analog-to-digital converter for converting the analog, frequency-converted signal into a corresponding digital signal,
    wherein the apparatus is used in a receiver without a filter between the mixer and the analog-to-digital converter, and
    wherein a frequency of the local oscillator signal is related to a sampling rate of the analog-to-digital converter to prevent aliasing that would otherwise result from the mixing and converting.

10. The apparatus in claim 9, wherein the frequency of the local oscillator signal is an integer multiple of half of the sampling rate of the analog-to-digital converter.

11. The apparatus in claim 9, wherein the frequency of the local oscillator signal $F_{LO}$ is $F_{LO}=n*F_{ADC}/2$, where $F_{ADC}$ is the sampling rate of the analog-to-digital converter, and n is a positive integer.

12. The apparatus in claim 9, wherein the analog, frequency-converted signal from the mixer is coupled directly to the analog-to-digital converter.

13. The apparatus in claim 9, further comprising:
an antenna;
a front end for processing a radio frequency signal received via the antenna; and
digital processing circuitry for processing the digital signal.

14. A method comprising:
receiving an analog signal;
mixing the received signal and a local oscillator signal to generate an analog, frequency-converted signal, and
converting the analog, frequency-converted signal into a corresponding digital signal using a sampling rate signal without filtering the analog, frequency-converted signal,
wherein a frequency of the local oscillator signal is set in relation to a frequency of a sampling rate of the analog-to-digital converter to avoid aliasing in a desired receive band.

15. The method in claim 14, wherein the frequency of the local oscillator signal is an integer multiple of half of the frequency of the sampling rate signal.

16. The method in claim 14, wherein the frequency of the local oscillator signal $F_{LO}$ is $F_{LO}=n*F_{ADC}/2$, where $F_{ADC}$ is the frequency of the sampling signal, and n is a positive integer.

17. The method in claim 14, further comprising:
determining a receive frequency band for the received signal and a sampling rate range for the analog to digital conversion;
defining limits for the frequency of the local oscillator signal in accordance with the receive frequency band and the frequency of the sampling signal in accordance with the sampling rate range; and
selecting, within the defined limits, the frequency of the local oscillator signal and the frequency of the sampling rate signal so that the frequency of the local oscillator signal is an integer multiple of half of the frequency of the sampling rate signal.

* * * * *